United States Patent [19]
Osugi et al.

[11] Patent Number: 6,114,215
[45] Date of Patent: Sep. 5, 2000

[54] GENERATING NON-PLANAR TOPOLOGY ON THE SURFACE OF PLANAR AND NEAR-PLANAR SUBSTRATES

[75] Inventors: Richard S. Osugi, Milpitas; Ronald J. Nagahara, San Jose, both of Calif.

[73] Assignee: LSI Logic Corporation, Milpitas, Calif.

[21] Appl. No.: 09/111,271

[22] Filed: Jul. 6, 1998

[51] Int. Cl.[7] ................................................. H01L 21/76
[52] U.S. Cl. ...................... 438/401; 438/633; 438/692; 438/693
[58] Field of Search .................... 438/401, 633, 438/692, 693

[56] References Cited

U.S. PATENT DOCUMENTS

| | | | |
|---|---|---|---|
| 5,846,398 | 12/1998 | Carpio | 205/775 |
| 5,863,825 | 1/1999 | Pasch et al. | 438/401 |
| 5,972,793 | 10/1999 | Tseng | 438/692 |

*Primary Examiner*—John F. Niebling
*Assistant Examiner*—Jennifer M. Kennedy
*Attorney, Agent, or Firm*—Beyer Weaver & Thomas, LLP

[57] ABSTRACT

A process for modifying an alignment mark is described. The process includes: (i) fabricating the alignment mark on an integrated circuit substrate surface, which alignment mark includes an alignment mark fill material of defined composition; and (ii) introducing a step in the alignment mark by polishing the integrated circuit substrate surface and removing at least some of the alignment mark fill material from the integrated circuit substrate to form a modified alignment mark. The modified alignment mark is capable of allowing an alignment tool to detect the modified alignment mark when the modified alignment mark is covered by an opaque layer and thereby align a first layer of the integrated circuit substrate to the opaque layer that is disposed above the first layer.

19 Claims, 5 Drawing Sheets

GENERATING NON-PLANAR TOPOLOGY ON THE SURFACE OF PLANAR AND NEAR-PLANAR SUBSTRATES

BACKGROUND OF THE INVENTION

The present invention relates to modifying alignment marks formed on surfaces of planar and near-planar integrated circuit (IC) substrates. The present invention more particularly relates to introducing a step in alignments marks formed on integrated circuit (IC) substrates using equipment related to chemical mechanical polishing.

FIG. 1 shows a top view of a portion of an IC substrate surface 10. A scribe line region 14, which is defined by scribe lines 6 and 8, is shown flanked by two active die regions 12 on IC substrate surface 10. After the fabrication of the IC substrate concludes, IC substrate surface 10 is cut along scribe lines 6 and 8 to form individual ICs or chips. Typically in scribe line region 14, a plurality of alignment marks or targets 16 are fabricated to facilitate the alignment of one layer to another subsequently deposited layer as described below. Furthermore, alignment marks 16 typically remain on the IC substrate surface during the various steps of IC substrate fabrication, e.g., deposition of various layers, photolithography, etching, etc. and after the fabrication of IC substrate has concluded, they may be discarded when IC substrate surface 10 is cut along scribe lines 6 and 8.

FIGS. 2A–2C show some major steps involved in the fabrication of one of alignment marks 16 on a surface of an IC substrate 20. The fabrication of alignment mark 16 may begin when a trench 24 is etched in a dielectric layer 22, as shown in FIG. 2A. According to FIG. 2B, a layer of metal 26 is then deposited on the surface of IC substrate 20, filling trench 24. Next, the surface of IC substrate 20 is subjected to chemical-mechanical polishing for polishing layer of metal 26 disposed above dielectric layer 22 and form alignment mark 16 as shown in FIG. 2C. Chemical-mechanical polishing (sometimes referred to as "CMP") typically involves mounting IC substrates face down on a substrate holder and rotating the IC substrate against a polishing pad mounted on a platen, which is in turn rotating or is in orbital state. A slurry containing a chemical that chemically interacts with the facing IC substrate layer and an abrasive that physically removes that layer is flowed between the IC substrate and the polishing pad or on the pad near the IC substrate. In semiconductor wafer fabrication, this technique is used to planarize various wafer layers such as dielectric layers, metallization layers etc.

An interconnect layer, e.g., a metal layer, is typically then blanket deposited on surface of IC substrate 20. Before the interconnect layer is patterned to form the various interconnects, however, an alignment tool aligns the placement of a reticle such that the circuit pattern to form the various interconnects is transferred to appropriate locations on the IC substrate surface. In other words, in order to ensure the formation of electrically conductive pathways in the IC substrate, the patterned interconnect layer should align to an underlying conductive layer that forms plugs, e.g., via plugs and contact plugs, which are the vertical interconnects between two successively deposited interconnect layers or between an interconnect layer and transistor device elements disposed below the interconnect layer, respectively.

Unfortunately, alignment marks, fabricated as described above, fail to effectively align a conductive layer (underlying a metal layer) to the metal layer. The alignment tool attempts to align the underlying conductive plug layer to the metal layer disposed above by detecting an optical difference, e.g., contrast due to topography, on the metal layer because the metal layer is opaque and not transparent like the dielectric layer. The alignment tool, however, fails to detect a contrast on the metal layer because the substantially planar IC substrate surface underlying the metal layer is devoid of any topography, e.g., hills or valleys, that generates the necessary contrast during alignment. Those skilled in the art will recognize that the effect of a misaligned mask layer can cause the entire circuit in an IC substrate to fail.

What is therefore needed is a process of making a modified alignment mark, which effectively facilitates an alignment tool to align an underlying layer to a an opaque layer, e.g., metal layer, that is disposed above.

SUMMARY OF THE INVENTION

To achieve the foregoing, in one aspect, the present invention provides a process for modifying an alignment mark. The process includes: (i) fabricating the alignment mark on an integrated circuit substrate surface, which alignment mark includes an alignment mark fill material of defined composition; and (ii) introducing a step in the alignment mark by polishing the integrated circuit substrate surface and removing at least some of the alignment mark fill material from the integrated circuit substrate to form a modified alignment mark. The modified alignment mark is capable of allowing an alignment tool to detect the modified alignment mark when the modified alignment mark is covered by an opaque layer and thereby align a first layer of the integrated circuit substrate to the opaque layer that is disposed above the first layer.

The step of fabricating the alignment mark may include: (i) etching a trench in a surface of a dielectric layer that is disposed above the integrated circuit substrate surface; (ii) blanket depositing the alignment mark fill material on the surface of the dielectric layer and filling the trench; and (iii) polishing the integrated circuit substrate surface to remove the alignment mark fill material deposited above the surface of the dielectric layer and excessive amounts of the alignment mark fill material deposited above the trench and thereby form the alignment mark.

The dielectric layer may be silicon dioxide. The trench may have a width that is between about 0.5 and about 8 $\mu$m and a length that is between about 80 and about 120 $\mu$m. The depth of the trench may depend on the thickness of the dielectric layer, for example, and is generally between about 3000 Angstroms and about 2 $\mu$m. The alignment mark fill material may include a metal, e.g., tungsten.

In one embodiment, the step of introducing the step (in the alignment mark) of the present invention includes introducing a step having a depth that is between about 100 Angstroms and about 2000 Angstroms. The step of introducing may be accomplished by chemical-mechanical polishing the integrated circuit substrate. The chemical-mechanical polishing of the integrated circuit substrate may include introducing on a polishing pad a slurry composition that has a metal etchant that is corrosive to the alignment mark fill material, but does not include the abrasive component that was used to planarize the substrate surface initially. The metal etchant may include at least one material selected from the group consisting of $Fe(NO_3)_3$, $H_2O_2$, $KIO_3$ for chemical-mechanical polishing of tungsten metal and an organic halide for chemical-mechanical polishing of copper and aluminum metals.

In another embodiment, the step of introducing the step includes fine polishing the integrated circuit substrate. The step of fine polishing includes introducing on a polishing pad a surfactant and a metal etchant mentioned above. The alignment tool may be one of a scanner and a stepper. The first layer may include at least one of tungsten, copper and aluminum that fills one of a contact hole and a via. The integrated circuit substrate may be a semiconductor wafer.

In another aspect, the present invention provides a process for modifying an alignment mark. The process includes: (i) fabricating the alignment mark in an integrated circuit substrate surface, which alignment mark includes an alignment mark fill material of defined composition; and (ii) introducing a step in the alignment mark by wet etching the integrated circuit substrate surface and removing at least some of the alignment mark fill material from the integrated circuit substrate surface to form a modified alignment mark. The modified alignment mark is capable of allowing an alignment tool to detect the modified alignment mark when the modified alignment mark is covered by an opaque layer and thereby align a first layer of the integrated circuit substrate to the opaque layer disposed above the first layer. The step of wet etching is performed after chemical-mechanical polishing of the integrated circuit substrate.

The step of wet etching may be performed in a wafer scrubber. The step of wet etching may be performed in the presence of a metal etchant mentioned above. The step of wet etching may be performed by a cleaning solution in a wet storage station before the IC substrate is undergoes cleaning, the cleaning solution includes a metal etchant.

These and other features of the present invention will be described in more detail below in the detailed description of the invention and in conjunction with the following figures.

DETAILED DESCRIPTION OF THE PREFERRED EMBODIMENTS

To achieve the foregoing, the present invention provides a process for modifying an alignment mark that introduces a step in the alignment mark using equipment that is typically associated with chemical-mechanical polishing. In the following description, numerous specific details are set forth in order to provide a thorough understanding of the present invention. It will be apparent, however, to those skilled in the art, that the present invention may be practiced without some or all of the specific details. In other instances, well known process steps have not been described in detail in order to not unnecessarily obscure the invention.

Figure 3A:
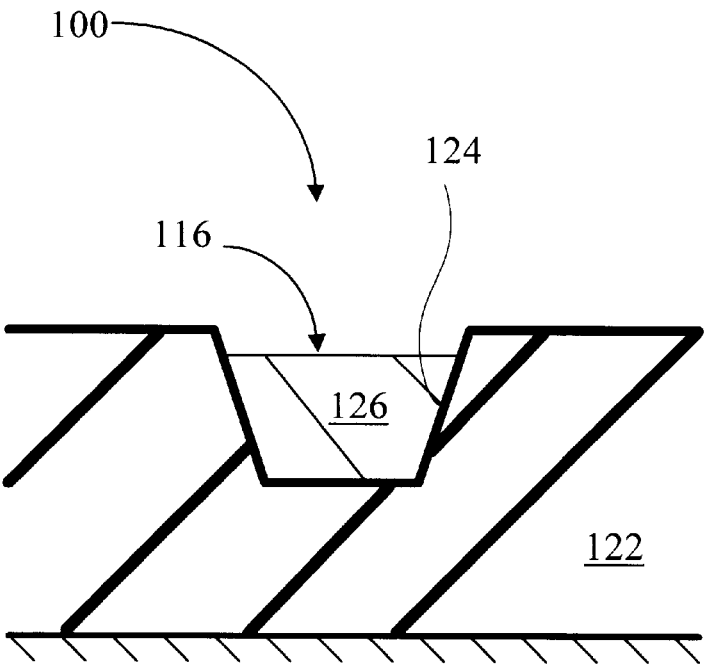
FIG. 3A shows a cross-sectional view of a partially fabricated integrated circuit substrate surface including a modified alignment mark, according to one embodiment of the present invention.

FIG. 3A shows a partially fabricated integrated circuit (IC) substrate, e.g., a partially fabricated semiconductor wafer, 100 having a modified alignment mark 116, according to one embodiment of the present invention, that is formed in a dielectric layer 122. Alignment mark 116 includes a trench 124 partially filled with an alignment mark fill material 126, which is similar to a plug composition, i.e. a contact or via plug composition, and therefore may include a metal like tungsten, for example. Trench 124 may have a width that is between about 0.5 and about 8 $\mu$m and a length that is between about 80 and about 120 $\mu$m. A depth of trench 124 may depend on the application and thickness of dielectric layer 122 and is generally between about 3000 Angstroms and about 2 $\mu$m.

Figure 1:
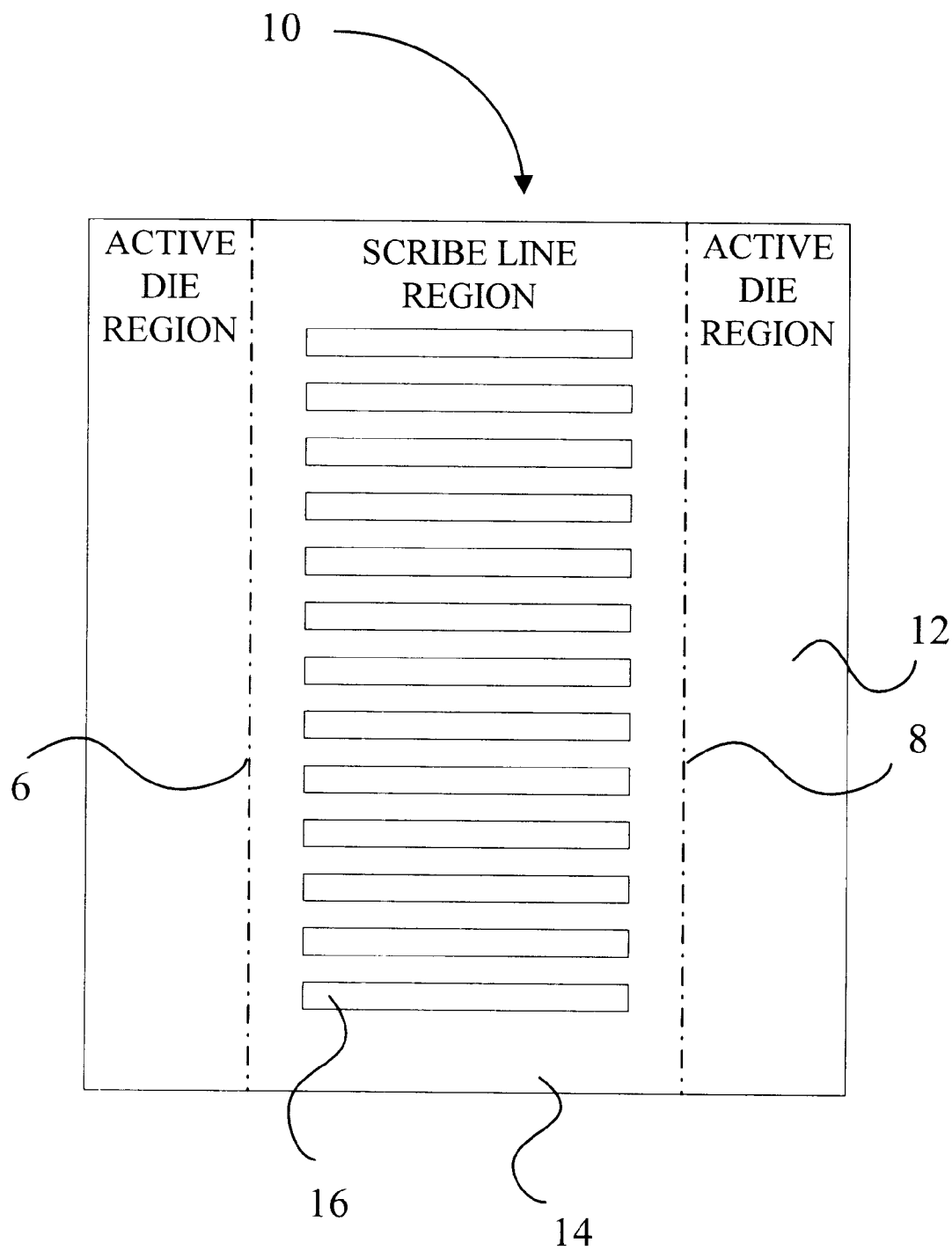
FIG. 1 shows a top view of a portion of an integrated circuit substrate surface that includes alignment marks.
Figure 2A:
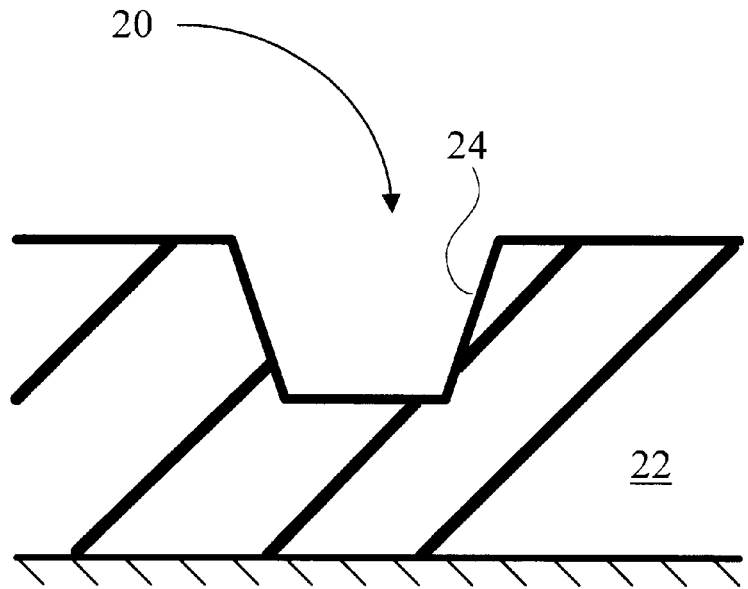
FIGS. 2A–2C shows some significant steps involved in fabricating an alignment mark of FIG. 1.
Figure 2B:
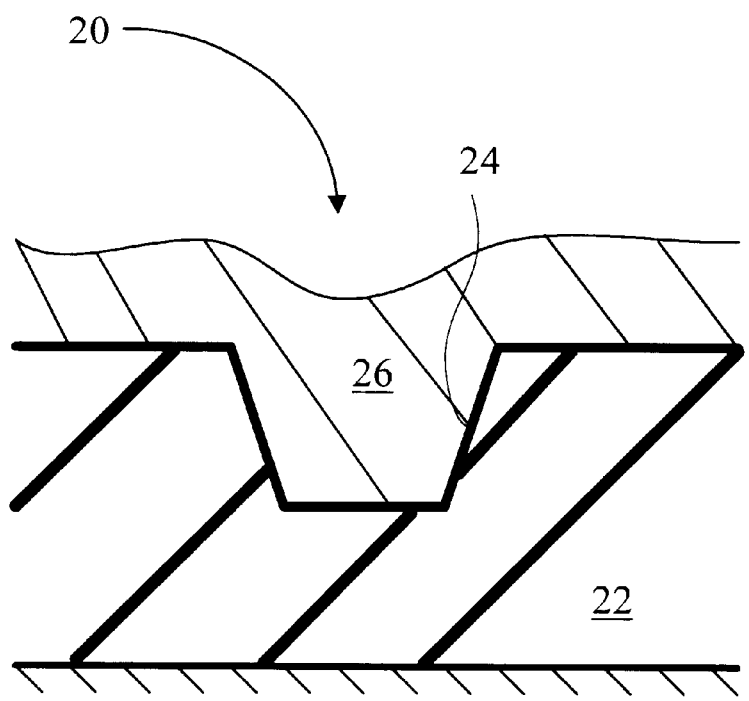
Figure 2C:
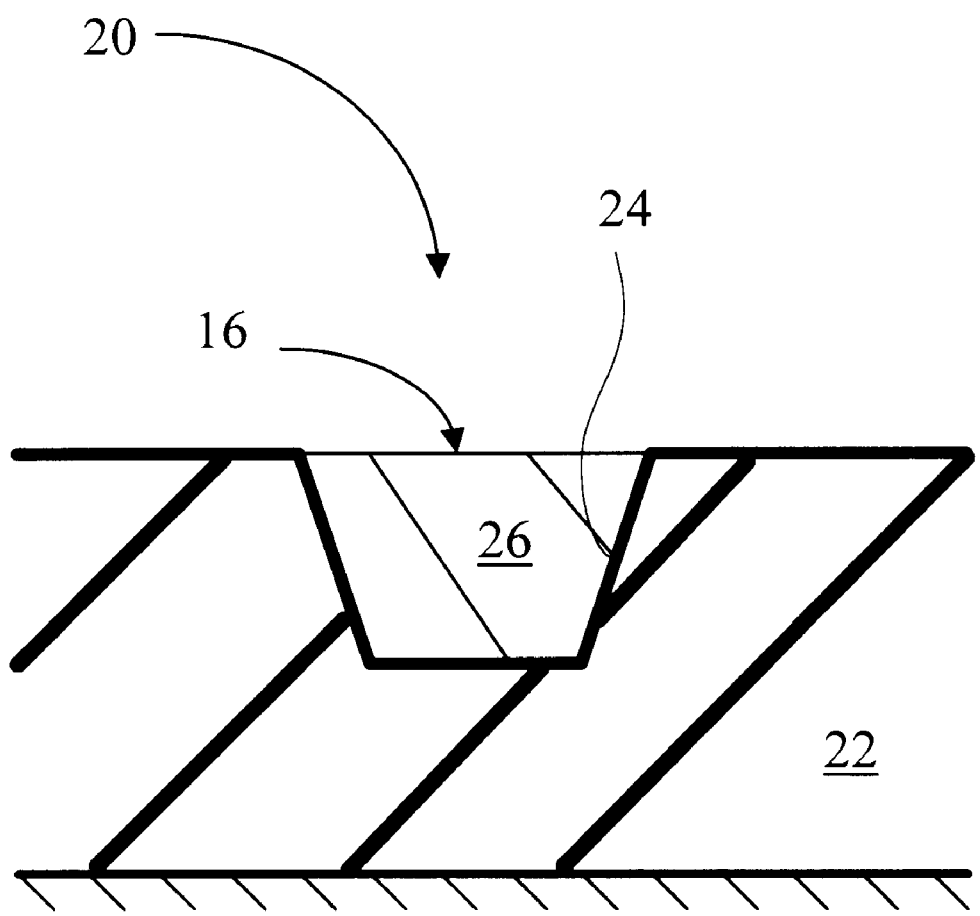

As shown in FIG. 3A, alignment mark 116 results after alignment mark 16 of FIG. 2C is modified to include a step. In other words, alignment mark fill material 26 of FIG. 2C is at least partially depleted to form the partially filled alignment mark (i.e. modified alignment mark 116) of FIG. 3A. It is important to note that alignment mark 116 facilitates in aligning the plugs formed in dielectric layer 122 in the adjacent active die areas, for example, to a metal layer that is subsequently deposited on the surface of IC substrate.

Figure 3B:
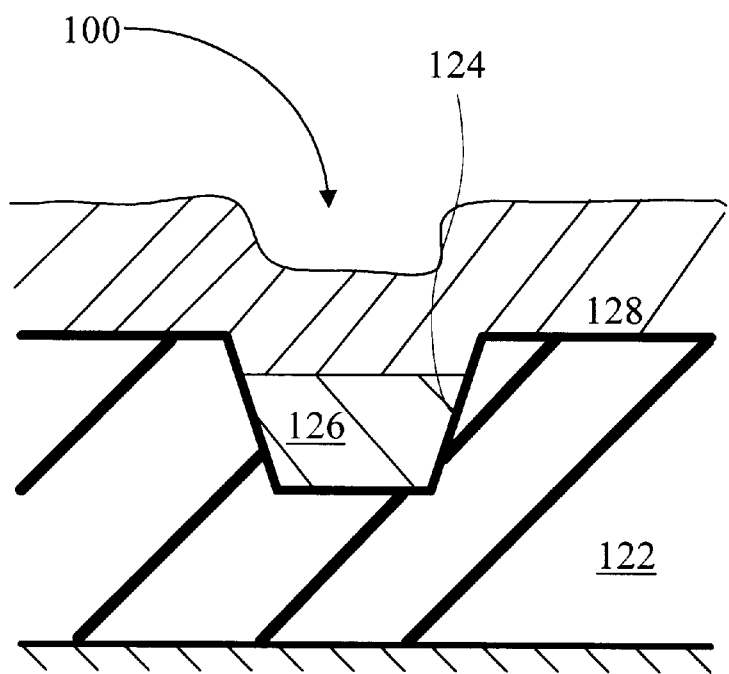
FIG. 3B shows a cross-sectional view of a partially fabricated integrated circuit substrate surface including the modified alignment mark of FIG. 3A and having disposed thereon a layer of metal.

FIG. 3B shows a layer of metal 128 that is blanket deposited on the surface of partially fabricated IC 100 of FIG. 3A and conforms to the substrate surface. As shown in FIG. 3B, above modified alignment mark 126, layer of metal 128 recesses inwardly into the step of alignment mark 126. Therefore, an alignment tool examining a top surface of partially fabricated IC 100 detects a difference in the contrast between layer of metal 128 disposed above dielectric layer 122 and layer of metal 128 disposed above alignment mark 116. The term "contrast," as used in connection with the description of this invention, means that some portions of a layer will appear relatively dark and other portions of the layer will appear relatively light. The contrast detected by the alignment tool is produced due to the nonplanar topography, i.e. hills and valleys, on the substrate surface underneath the opaque metal layer. In other words, the nonplanarity of the layer of metal above the modified alignment mark and the dielectric layer produces a contrast that facilitates an alignment tool during alignment.

Figure 4:
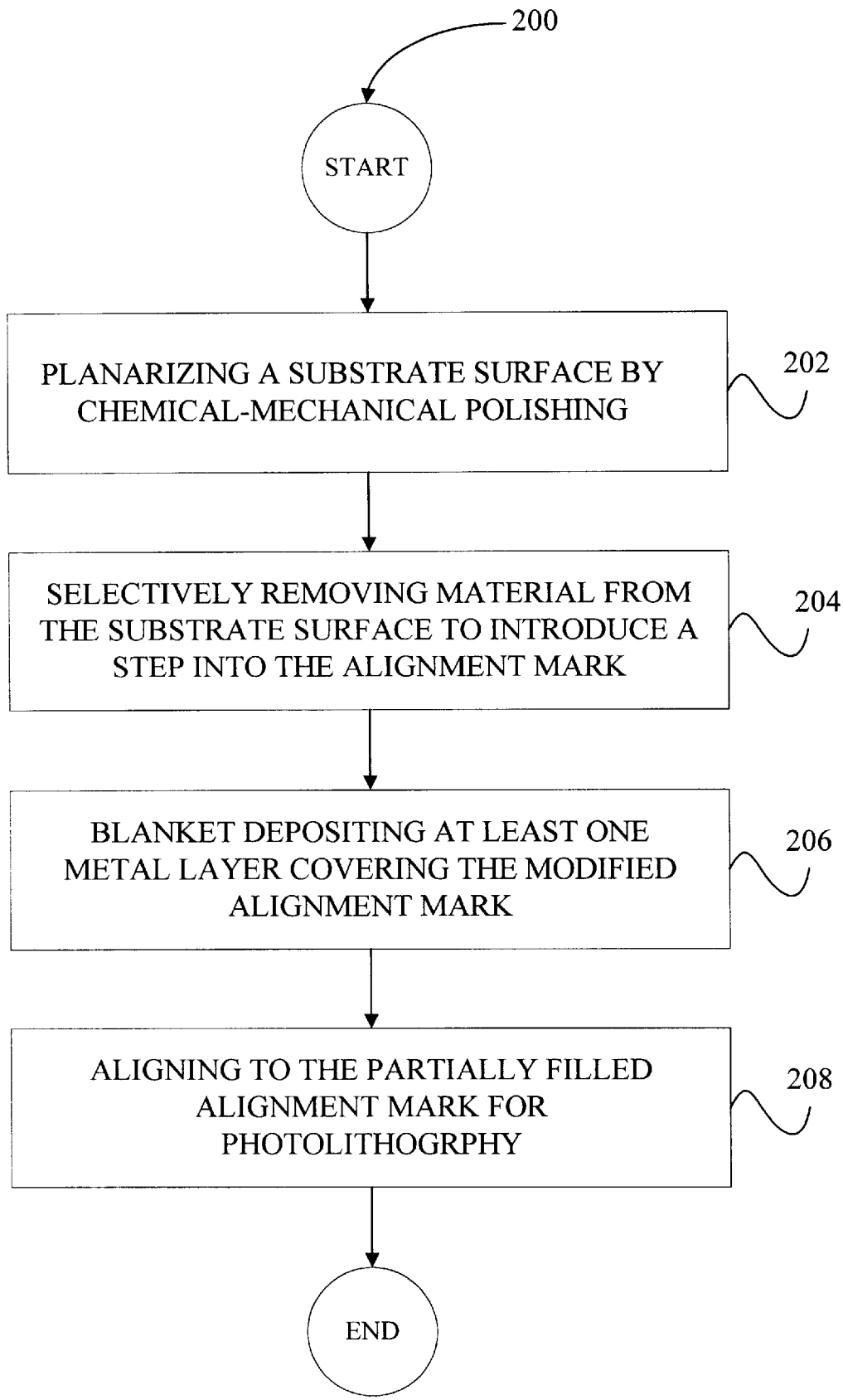
FIG. 4 is a flowchart showing some significant steps in a process for modifying an alignment mark, according to one embodiment of the present invention, and aligning an alignment tool using the modified alignment mark.

FIG. 4 shows a process 200, according to one embodiment of the present invention, of modifying an alignment mark. Before process 200 begins, however, the alignment mark fabrication steps as discussed above in reference to FIGS. 2A–2B are carried out. It is important to note that the alignment mark fill material 26 of FIG. 2B is generally substantially the same as the composition of plugs in the active die areas because the same layer of metal 26 of FIG. 2B that is blanket deposited on the surface of the dielectric layer fills the trenches and contact holes or vias in the active die areas.

A step 202 includes planarizing the partially fabricated IC substrate surface by chemical-mechanical polishing (CMP). A slurry including an oxidizing component and an abrasive component is employed during CMP. If the layer of metal includes tungsten, then the oxidizing component may include ferric nitrate ($Fe(NO_3)_3$), for example, and the abrasive component includes alumina ($Al_2O_3$), for example. During tungsten CMP, ferric nitrate oxidizes the tungsten to form tungsten oxide that is abraded by the alumina ($Al_2O_3$) particles in the slurry. In this manner, a layer of metal is removed to form the structure shown in FIG. 2C.

Next, a step 204 includes selectively removing material from the IC substrate surface to introduce a step into the alignment mark. In this step, the alignment mark is modified using equipment that is typically associated with CMP. In one embodiment, this step may be carried out using a conventional chemical-mechanical polishing apparatus, which employs a slurry composition that is corrosive to the alignment mark fill material, but does not polish the dielectric layer surrounding the alignment mark to the same extent. In one embodiment, the slurry composition employed in step 204 may include the oxidizing component mentioned above without including the abrasive component. By way of example, if the alignment mark fill material includes tungsten, then in this step the slurry composition may include ferric nitrate ($Fe(NO_3)_3$) without including the abrasive component, e.g., alumina ($Al_2O_3$). In other words, in step 204 the slurry composition may include a metal etchant that is relatively more corrosive to the alignment mark fill material than the dielectric layer surrounding the alignment mark. The metal etchant may be at least one material selected from the group consisting of ferric nitrate ($Fe(NO_3)_3$), alumina ($Al_2O_3$), potassium iodate ($KIO_3$) for CMP of tungsten metal and any organic halide for CMP of copper and aluminum metals.

In an another embodiment, step 204 of the present invention is performed during fine polishing of the partially fabricated IC substrate surface. Typically during fine polishing, also well known in the art as "buffing," an IC substrate surface undergoes polishing that is far less coarse than the CMP process described in step 202. Fine polishing is typically carried out in the presence of a buffing solution, which generally does not contain abrasive particles to initiate any abrasions on the IC substrate surface during fine polishing. This step is typically employed in some IC substrate fabrication applications to remove a contaminated IC substrate layer, i.e. including contaminants from the slurry residue and/or eroded material, resulting from the CMP process. Conventionally, the buffing solution includes a dilute solution of a surfactant, such as between about 1% and about 3% (in volume) of ammonium hydroxide ($NH_4OH$) in deionized water. According to one embodiment of the present invention, however, the metal etchant described above is admixed with the buffing solution. Consequently, at least some of the alignment mark fill material is selectively removed from the IC substrate surface during the fine polishing of the IC substrate surface and a step is introduced into the alignment mark as shown in FIG. 3A.

In yet another embodiment, step 204 of the present invention is performed in a wet storage station that typically follows CMP or fine polishing. Typically, the IC substrates are soaked or drenched in a bath of deionized water, before they are subjected to vigorous cleaning in a wafer scrubber by various cleaning solutions. In this embodiment, the metal etchant mentioned above is admixed with the soaking solution, e.g., including deionized water, employed in the wet storage station to selectively remove the alignment mark fill material from IC substrate surface and thereby introduce a step into the alignment mark.

In yet another embodiment, step 204 of the present invention is performed as a wet etch step after CMP or fine polishing in a wafer scrubber. In some CMP apparatuses, e.g., Avant Gaard 776, which is commercially available from Integrated Processing Equipment Corporation (IPEC) of Phoenix, Ariz., a wafer scrubber designed to scrub and clean the IC substrates after polishing is integrated into the polishing apparatus. In this embodiment, the metal etchant mentioned above is admixed with the various cleaning solutions employed during scrubbing and cleaning in the integrated wafer scrubber to selectively remove the alignment mark fill material from the IC substrate surface and thereby introduce a step into the alignment mark.

IC fabrication processes that employ other CMP apparatus, e.g., Avanti 472 and Avant Gaard 676, both of which are also commercially available from Integrated Processing Equipment Corporation (IPEC) of Phoenix, Ariz., and do not include a wafer scrubber typically accomplish IC substrate cleaning in a separate wafer scrubber, e.g., DSS 200 Series 2 Wafer Scrubber System, commercially available from On trak, Systems of San Jose, Calif. In such systems, where the CMP is separated from the wafer scrubber, the metal etchant is admixed with the various cleaning solutions employed during cleaning in the wafer scrubber to selectively remove the alignment mark fill material from the IC substrate surface and thereby introduce a step into the alignment mark.

Regardless of how the alignment mark is modified, it is important to strike a balance in the amount of alignment mark fill material that is removed from the IC substrate surface. If an excessive amount of the alignment composition is removed in step 204, an alignment mark with a deeper step is created at the expense of an unduly depleted plug composition in the plugs, e.g., contact or via plugs. Those skilled in the art will recognize that unduly depleted plug composition may cause the resulting IC to suffer from catastrophic device failure. It is important to note that the alignment mark with a deeper step is desired because it produces a greater contrast for the alignment tool, e.g., scanner or stepper, during alignment.

If a sufficient amount of the alignment mark fill material is not removed in step 204, however, then the resulting step introduced in the alignment mark is not going to be deep enough to produce the desired contrast and assist the alignment tool in detecting the alignment mark during the aligning process. Generally, enough alignment mark fill material is removed from the substrate surface to create a step that has a depth of between about 100 and about 2000 Angstroms.

Those skilled in the art will recognize that it is not intuitive to use equipment conventionally associated with a CMP apparatus, as described above, to introduce a nonplanarity on the IC substrate surface because such equipment is typically used to planarize an IC substrate surface.

A step 206 then includes blanket depositing at least one metal layer that conforms to the non-planarity of the alignment mark and the adjacent dielectric layer as shown in FIG. 3B. It should be borne in mind that multiple metal layers may be deposited in step 206. Next, a step 208 includes aligning of the alignment tool using the contrast produced by the modified alignment mark so that photolithography may begin. As mentioned above, a contrast is created between a portion of a layer of metal disposed above the alignment mark and a portion of a layer of metal disposed above the dielectric layer surrounding the alignment mark.

The present invention has several advantages. By way of example, the modification of an alignment mark according to the present invention is not affected by process changes. Those skilled in the art will recognize that the prior art methods of aligning an underlying layer to a metal layer disposed above using an alignment mark may be affected by variations in the IC fabrication process. Depending on the technique of fabricating an alignment mark, some alignment mark dimensions are well suited to a particular process and a slight change in the process may render them ineffective during the alignment process. Consequently, IC fabrication facilities that use such alignment marks are forced to expend resources and time to perform elaborate testing to determining a new alignment mark having appropriate dimensions that account for variations in the IC fabrication process. Modifying the alignment mark according to the present invention is, however, independent of such process variations because a step is introduced into the alignment mark after the IC substrate surface is completely planarized, regardless of the alignment mark dimensions. As a result, an IC fabrication facility modifying an alignment mark according to the present invention need not expend valuable resources and time to determine new alignment mark dimensions every time a variation is introduced into the IC fabrication process.

As another example, the present invention also increases the throughput of the IC fabrication process because after planarization, modifications to the alignment mark are made using the same equipment, i.e., a CMP apparatus, that is associated with the previous step of planarization. Consequently, there is no need to transport the substrates to another tool for modification of the alignment mark. Furthermore, the resources and time expended to maintain another tool are also eliminated by the inventive process described above.

Although the foregoing invention has been described in some detail for purposes of clarity of understanding, it will be apparent that certain changes and modifications may be practiced within the scope of the appended claims. For example, while the specification has been described in terms of producing a contrast on a layer of metal by introducing a step in the alignment mark disposed underneath, there is in principal no reason why the teachings of the present invention cannot apply to aligning an underlying layer to any overlying opaque layer (that is conductive or non-conductive). Therefore, the present embodiments are to be considered as illustrative and not restrictive, and the invention is not to be limited to the details given herein, but may be modified within the scope of the appended claims.

What is claimed is:

1. A process for modifying an alignment mark, comprising:
    fabricating said alignment mark on an integrated circuit substrate surface, said alignment mark including an alignment mark fill material of defined composition; and
    introducing a step in said alignment mark by chemical-mechanical polishing or fine polishing said integrated circuit substrate surface under conditions that preferentially remove at least some of said alignment mark fill material from said integrated circuit substrate to form a modified alignment mark that is capable of allowing an alignment tool to detect said modified alignment mark when said modified alignment mark is covered by an opaque layer and thereby align a first layer of said integrated circuit substrate to said opaque layer that is disposed above said first layer.

2. The process of claim 1, wherein said fabricating said alignment mark includes:
    etching a trench in a surface of a dielectric layer that is disposed above said integrated circuit substrate surface;
    blanket depositing said alignment mark fill material on said surface of said dielectric layer and filling said trench; and
    polishing said integrated circuit substrate surface to remove said alignment mark fill material deposited above said surface of said dielectric layer and excessive amounts of said alignment mark fill material deposited above said trench and thereby form said alignment mark.

3. The process of claim 2, wherein said dielectric layer is silicon dioxide.

4. The process of claim 2, wherein said trench has a width that is between about 0.5 and about 8 $\mu$m.

5. The process of claim 2, wherein said trench has a length that is between about 80 and about 120 $\mu$m.

6. The process of claim 2, wherein said trench has a depth that is between about 3000 Angstroms and about 2 $\mu$m.

7. The process of claim 1, wherein said alignment mark fill material includes a metal.

8. The process of claim 7, wherein said alignment mark fill material includes tungsten.

9. The process of claim 1, wherein said introducing said step includes introducing said step having a depth that is between about 100 Angstroms and about 2000 Angstroms.

10. The process of claim 1, wherein said introducing said step includes chemical-mechanical polishing said integrated circuit substrate.

11. The process of claim 1, wherein said chemical-mechanical polishing said integrated circuit substrate includes introducing on a polishing pad a slurry composition that includes an abrasive component and a metal etchant that is corrosive to said alignment mark fill material.

12. The process of claim 11, wherein said metal etchant includes at least one material selected from the group consisting of $Fe(NO_3)_3$, $H_2O_2$, $KIO_3$ and an organic halide.

13. The process of claim 11, wherein said abrasive component includes $Al_2O_3$.

14. The process of claim 1, wherein said introducing said step includes fine polishing said integrated circuit substrate.

15. The process of claim 14, wherein said fine polishing includes introducing on a polishing pad a surfactant and a metal etchant.

16. The process of claim 15, wherein said metal etchant includes at least one material selected from the group consisting of $Fe(NO_3)_3$, $H_2O_2$, $KIO_3$ and an organic halide.

17. The process of claim 1, wherein said alignment tool is one of a scanner and a stepper.

18. The process of claim 1, wherein said first layer includes a layer of tungsten that fills one of a contact hole or a via.

19. The process of claim 1, wherein said integrated circuit substrate is a semiconductor wafer.

* * * * *